United States Patent [19]
Jaff

[11] Patent Number: 5,384,692
[45] Date of Patent: Jan. 24, 1995

[54] SOCKET WITH IN-SOCKET EMBEDDED INTEGRATED CIRCUIT

[75] Inventor: Kosar A. Jaff, Folsom, Calif.

[73] Assignee: Intel Corporation, Santa Clara, Calif.

[21] Appl. No.: 168,459

[22] Filed: Dec. 16, 1993

[51] Int. Cl.$^6$ .............................................. H05K 7/02
[52] U.S. Cl. .................... 361/807; 361/785; 361/735; 361/809; 174/52.4; 439/68; 439/73
[58] Field of Search ............... 361/784, 785, 735, 807, 361/748, 761, 869; 174/52.4, 255; 439/68, 70, 71, 73

[56] References Cited

U.S. PATENT DOCUMENTS

| | | | |
|---|---|---|---|
| 4,716,526 | 12/1987 | Mori et al. | |
| 5,057,904 | 10/1991 | Nagato et al. | 357/74 |
| 5,123,850 | 6/1992 | Elder et al. | 439/67 |
| 5,240,421 | 8/1993 | Uratsuji | |
| 5,240,429 | 8/1993 | Myers | |
| 5,243,133 | 9/1993 | Engle et al. | |
| 5,309,324 | 5/1994 | Herandez | 361/734 |

FOREIGN PATENT DOCUMENTS

| | | |
|---|---|---|
| 0411806A2 | 2/1991 | European Pat. Off. |
| 0510241A1 | 10/1992 | European Pat. Off. |
| 0529142A1 | 3/1993 | European Pat. Off. |

*Primary Examiner*—Leo P. Picard
*Assistant Examiner*—Young Whang
*Attorney, Agent, or Firm*—Blakely, Sokoloff, Taylor & Zafman

[57] ABSTRACT

A socket for mounting an external integrated circuit on a printed circuit board is described. The socket includes a base having a bottom that can be mounted on the printed circuit board and a top that can receive the external integrated circuit. A plurality of connectors are located on the top of the base for coupling to the external integrated circuit. An in-socket embedded integrated circuit is embedded inside the base for providing a predetermined electronic function. The external integrated circuit and the in-socket embedded integrated circuit occupy substantially minimized space on the printed circuit board. The external integrated circuit can be a microprocessor and the in-socket integrated circuit can also include a microprocessor. The socket can be used for a computer system that allows the embedded microprocessor functioning when the external microprocessor is not coupled to the plurality of connectors of the base. When the external microprocessor is coupled to the plurality of connectors of the base, the computer system can be either a multiprocessor system or a single processor system with only the external microprocessor functioning. An in-socket embedded interfacing circuit is also embedded inside the base for interfacing the external microprocessor with circuitry on the printed circuit board. A single socket upgradable computer system is also described.

24 Claims, 6 Drawing Sheets

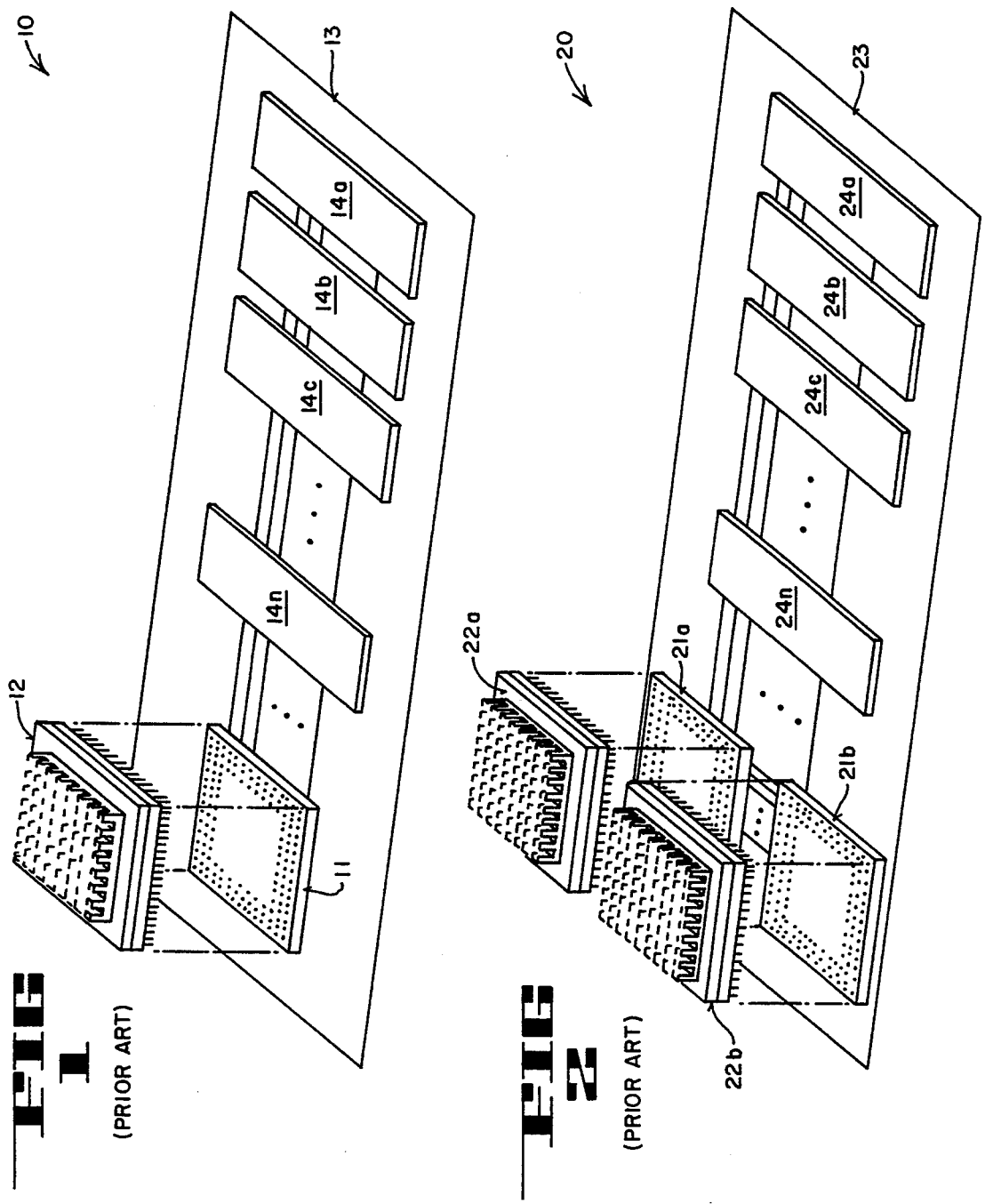

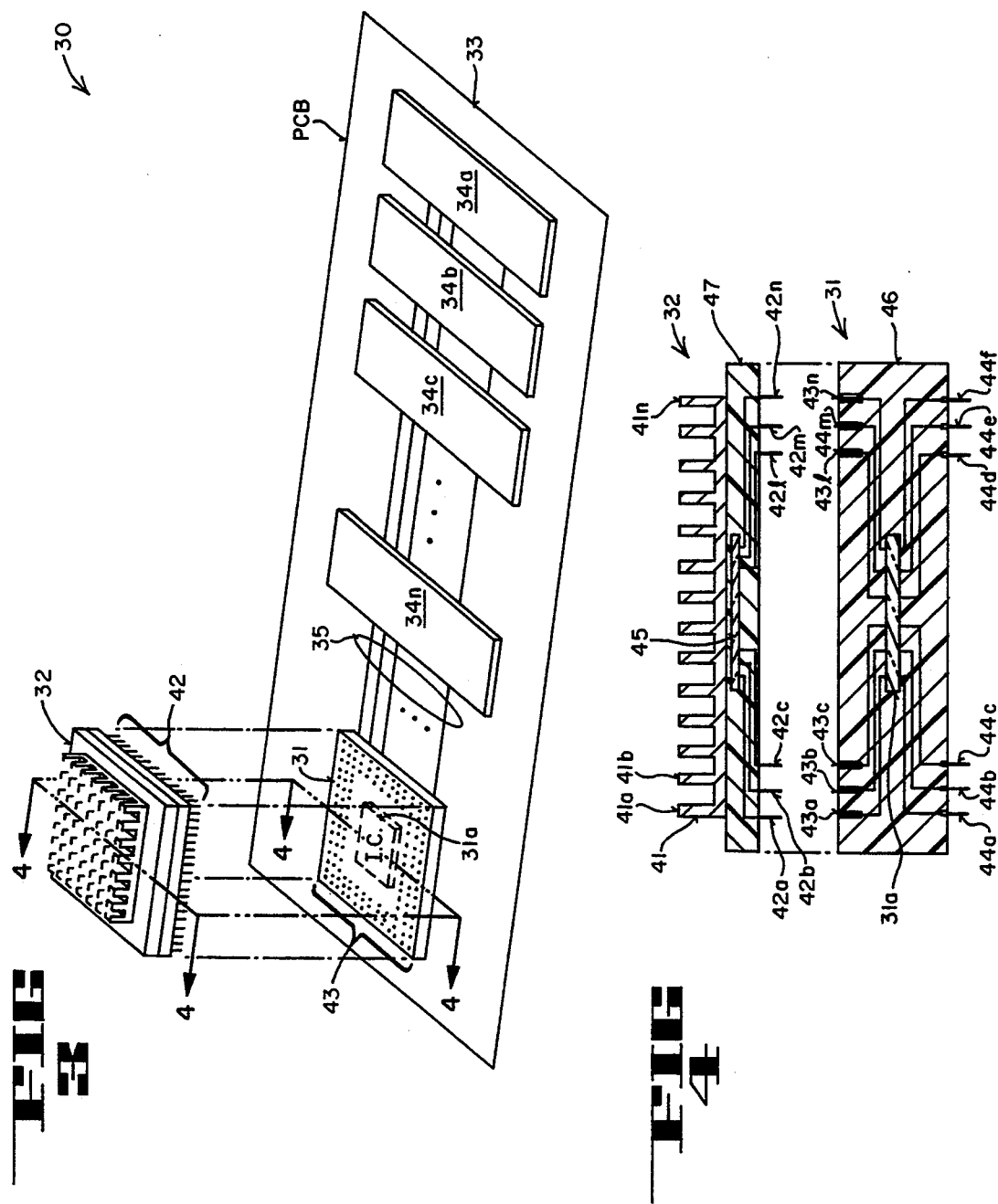

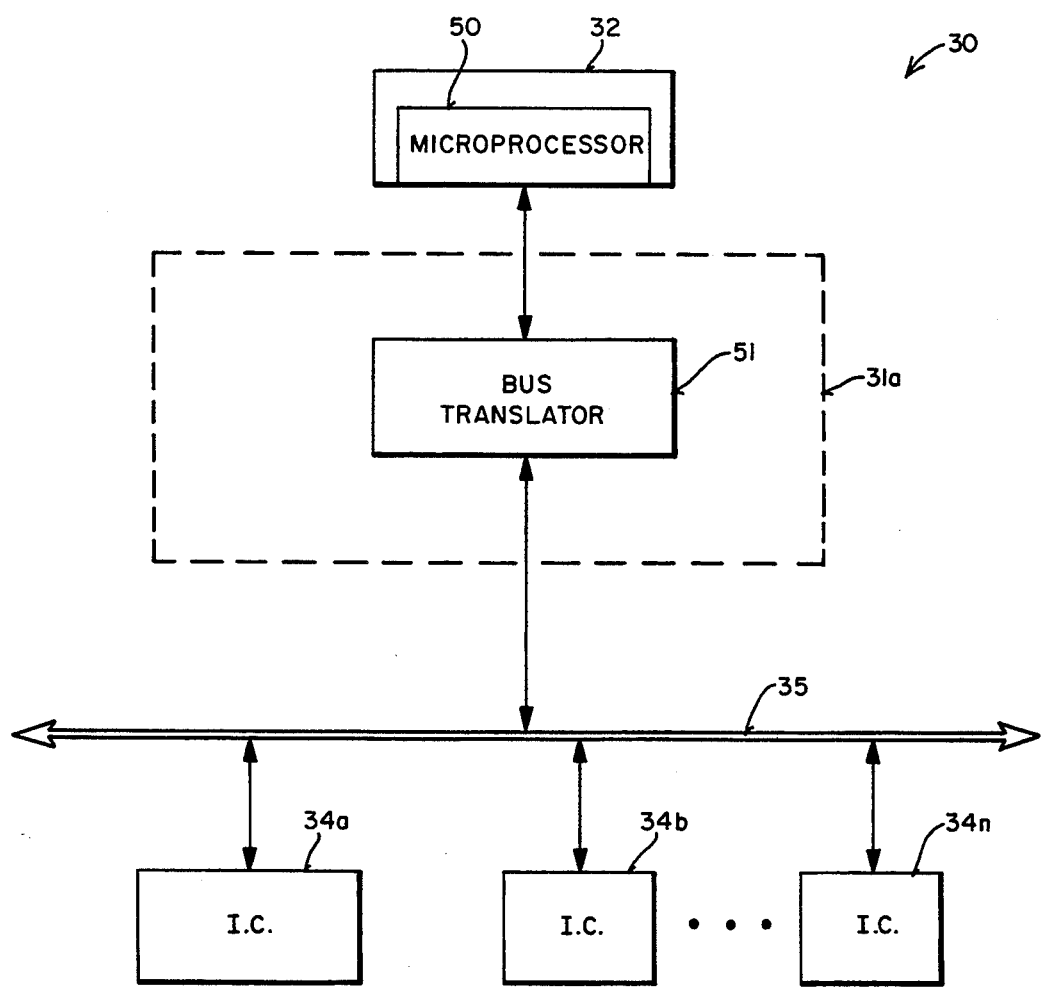

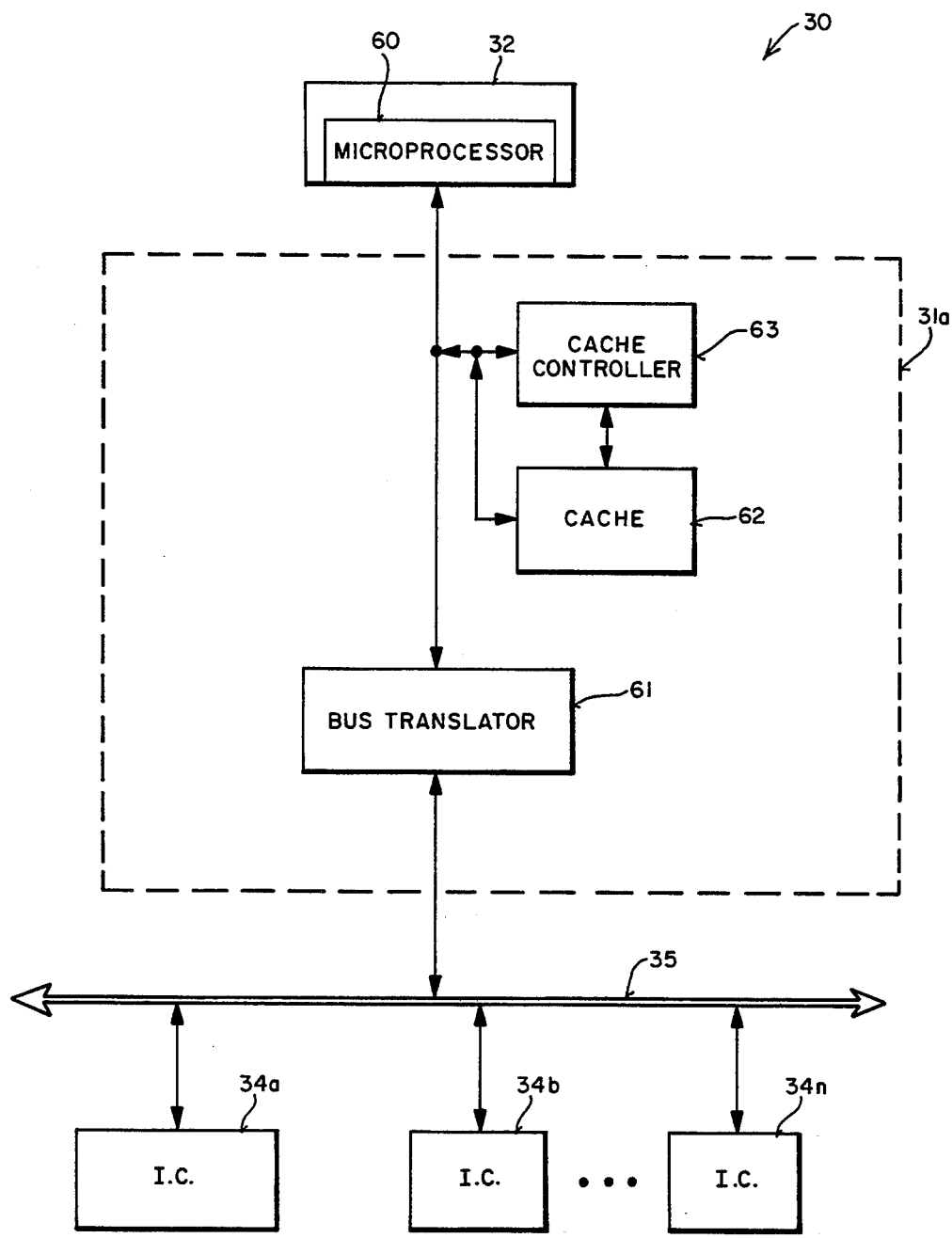

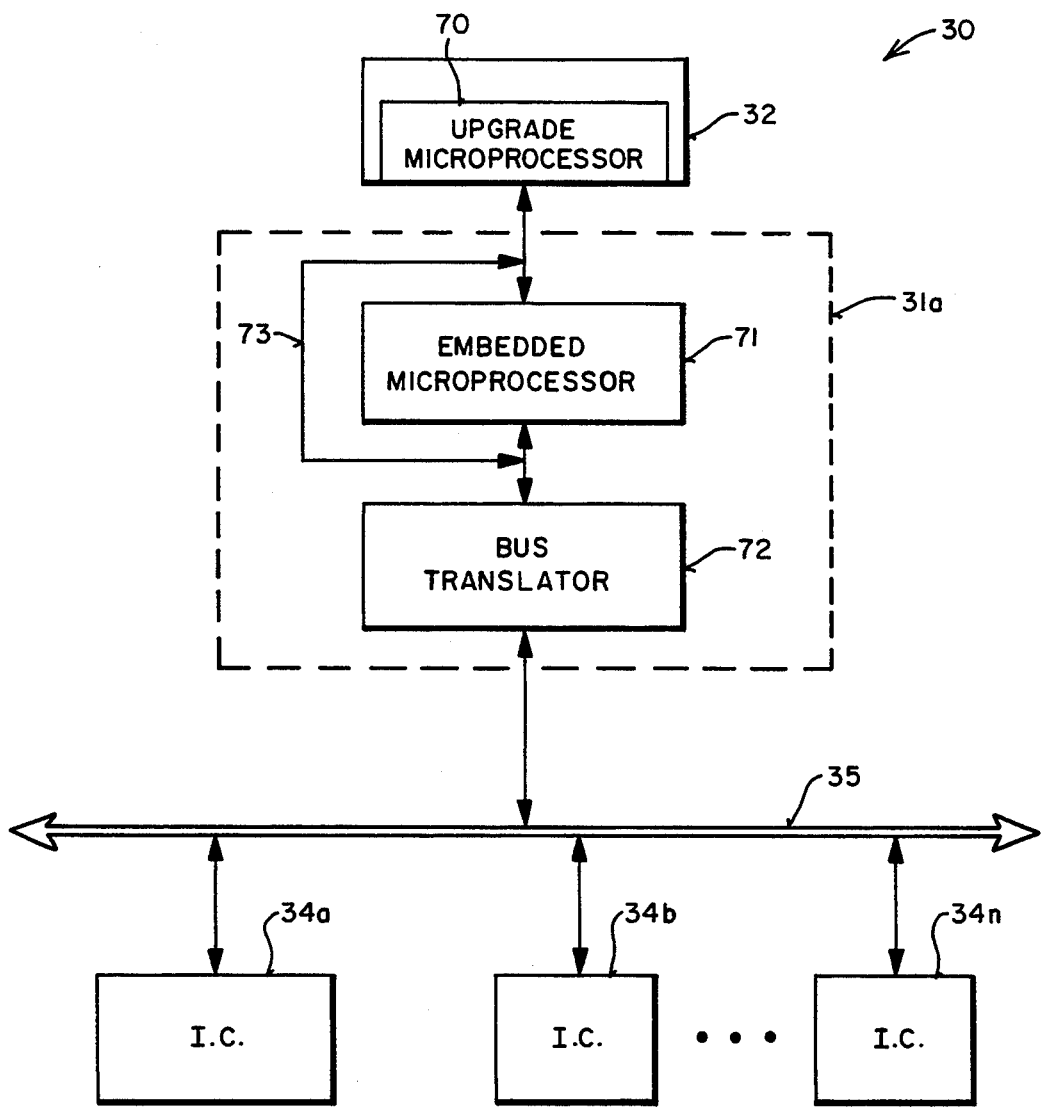

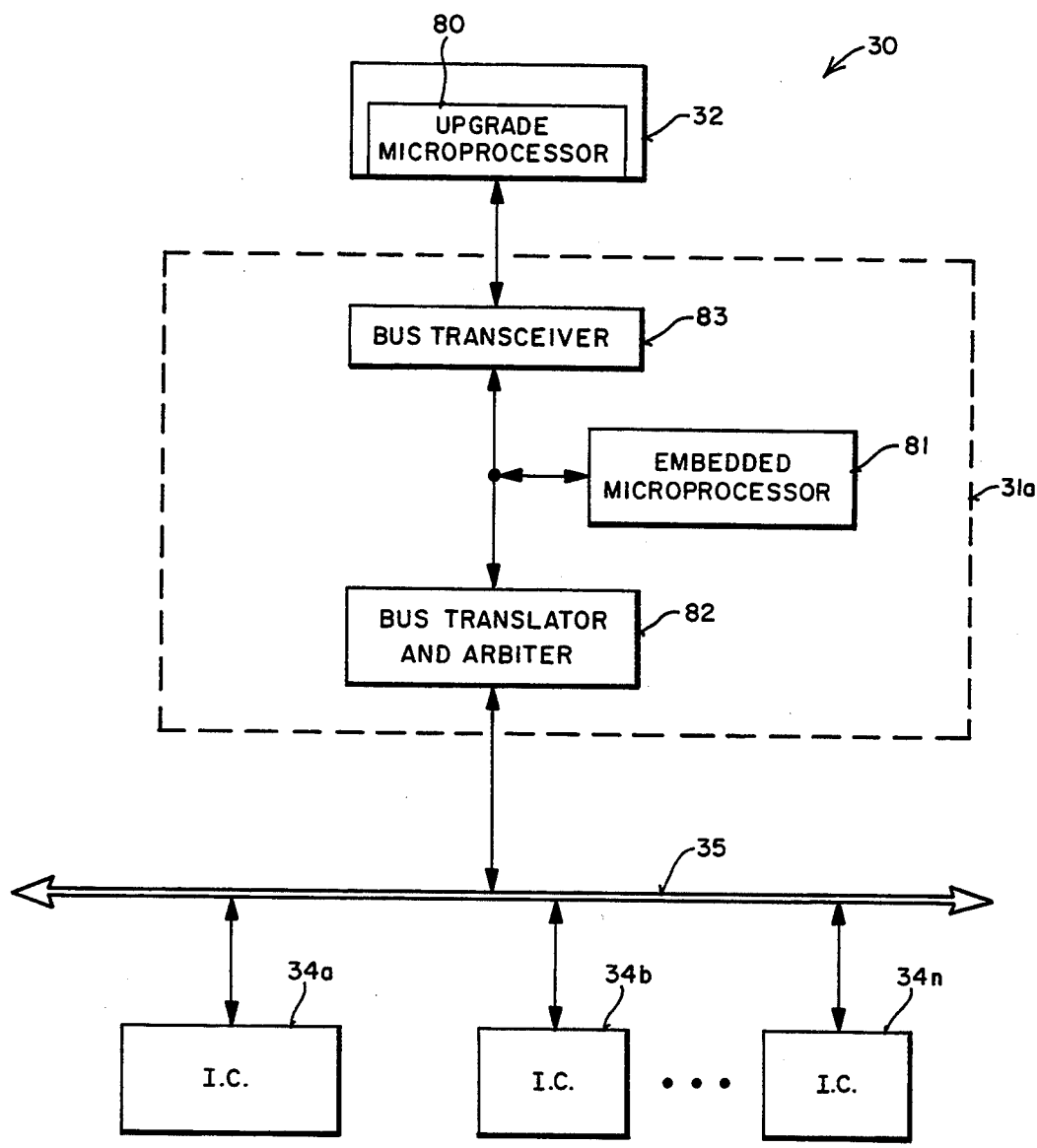

SOCKET WITH IN-SOCKET EMBEDDED INTEGRATED CIRCUIT

FIELD Of THE INVENTION

The present invention pertains to the field of sockets that are mounted on printed circuit boards. More particularly, this invention relates to a socket on a printed circuit board ("PCB") of a computer system for securing an integrated circuit on the PCB, wherein the socket additionally includes an in-socket embedded integrated circuit that may comprise a microprocessor such that less space of the printed circuit board is required for mounting integrated circuits on the PCB.

BACKGROUND OF THE INVENTION

Prior art personal computer systems typically use microprocessors. When a microprocessor is used in a computer system, a socket is typically employed to secure the microprocessor onto the PCB on which other circuitry of the computer system resides. The socket is typically surface mounted or pin plugged onto the PCB. The socket also typically includes female type contact holes on the top of the socket for allowing pins of the microprocessor to be inserted so as to secure the microprocessor in the socket. FIG. 1 illustrates a prior art computer system 10 that employs a socket 11 to mount a microprocessor 12 on PCB 13. As can be seen in FIG. 1, socket 11 is mounted on PCB 13 on which other integrated circuits 14a–14n are mounted. Socket 11 can be surface mounted or pin plugged onto PCB 13. Microprocessor 12 is then inserted onto socket 11. Socket 11 may be a zero insertion force ("ZIF") socket which allows for zero insertion force insertion and removal of the microprocessor.

Computer system 10 can be upgraded in performance through substitution of elements. The new elements typically have higher performance capabilities than the elements already in the system. For example, computer system 10 of FIG. 1 can be upgraded by substituting microprocessor 11 with a new microprocessor of higher performance.

Disadvantages are, however, associated with the prior art computer system. One disadvantage is that it is typically difficult to upgrade a computer system by substituting the microprocessor in the original computer system with a higher performance microprocessor. This is due to the fact that each type of microprocessor typically has its own pin configuration and definition. A socket for an older generation microprocessor may not fit for a new generation microprocessor. In this case, a new socket is typically required. An example of this is a socket for an INTEL Pentium TM overdrive microprocessor, which typically contains an extra row of pin-sockets to accommodate the Pentium TM overdrive microprocessor than the socket for an INTEL i486 TM microprocessor.

Moreover, each type of microprocessor typically requires different system configuration of the computer system. In addition, in order to accommodate a new upgrade microprocessor which is based on an alternate architecture, the microprocessor bus interface design for the original microprocessor must be drastically altered in order to allow the new upgrade microprocessor to function properly in the system that was designed for the original microprocessor. For example, the INTEL Pentium TM overdrive upgrade microprocessor is based on the Pentium TM microprocessor architecture.

In order for the Pentium TM overdrive upgrade microprocessor to function properly in a system that was originally designed for INTEL i486 TM microprocessor, the Pentium TM overdrive upgrade microprocessor's bus interface design must be changed to function as though it were operating on an INTEL i486 microprocessor bus. Thus, when an upgrade microprocessor is used to substitute the original microprocessor already in the system, additional logic circuits are typically required to interface the upgrade microprocessor with the circuitry of the computer system.

One prior solution to the problems is shown in FIG. 2. As can be seen in FIG. 2, a prior computer system 20 includes two sockets 21a and 21b mounted on a PCB 23. Socket 21a is used to secure an original microprocessor 22a on PCB 23 and socket 21b is used for an upgrade microprocessor 22b. An interface circuit 24n is mounted on PCB 23 to interface the microprocessors to other circuits of computer system 20. Typically, computer system 20 first operates with microprocessor 22a in socket 21a. When upgrade of the computer system 20 is needed, microprocessor 22a is either removed from socket 21a or electrically disconnected from the system. Upgrade microprocessor 22b is then plugged in socket 21b and computer system 20 operates with upgrade microprocessor 22b.

Disadvantages are, however, still associated with the prior arrangement as shown in FIG. 2. One disadvantage is that the printed circuit board is typically required to be relatively large in order to accommodate the two sockets. This typically causes the size of the computer system to be accordingly large. Another disadvantage is that the cost of the computer system typically increases as it contains more than one microprocessor socket in the system. At least one of the sockets is typically not used in the system at one time. Moreover, the printed circuit board also needs to house the interface circuit (i.e., interface circuit 24n of FIG. 2) that interfaces the microprocessors with the remaining circuits of the computer system. This typically occupies some space on the printed circuit board that causes the printed circuit board to be relatively large.

SUMMARY AND OBJECTS OF THE INVENTION

One of the objects of the present invention is to increase the number of integrated circuit chips mounted on a printed circuit board without increasing the size of the printed circuit board.

Another object of the present invention is to reduce the size of the printed circuit board without reducing the number of integrated circuit chips mounted on the printed circuit board.

Another object of the present invention is to provide a socket that is electronically fit for various integrated circuit chips such that separate socket sites need not be reserved on the printed circuit board for future upgrade.

A further object of the present invention is to in-socket embed integrated circuits in a socket mounted on a printed circuit board such that less space on the printed circuit board is required for mounting integrated circuits on the printed circuit board.

A still further object of the present invention is to allow the future generation microprocessors to be installed in an existing computer system without requiring costly interfacing, voltage conversion, and clocking changes.

A socket for mounting an external integrated circuit on a printed circuit board is described. The socket includes a base having a bottom that can be mounted on the printed circuit board and a top that can receive the external integrated circuit. A plurality of connectors are located on the top of the base for coupling to the external integrated circuit when the external integrated circuit resides on the top of the base. An in-socket embedded integrated circuit is embedded inside the base for providing a predetermined electronic function. The external integrated circuit and the in-socket embedded integrated circuit occupy substantially minimized space on the printed circuit board.

A socket for mounting an external microprocessor on a printed circuit board of a computer system includes a base having a bottom that can be mounted on the printed circuit board and a top on which the external microprocessor can reside. The external microprocessor can be a first type of microprocessor or a second type of microprocessor. A plurality of connectors are located on the top of the base for coupling to the external microprocessor when the external microprocessor resides on the top of the base. An in-socket embedded interfacing circuit is embedded inside the base for interfacing the external microprocessor with circuitry of the computer system on the printed circuit board when the external microprocessor residing on the top of the base is the first type of microprocessor and when the socket is mounted on the printed circuit board such that substantially minimized space on the printed circuit board is required for the external microprocessor and the interfacing circuit.

A socket for mounting an external microprocessor on a printed circuit board of a computer system includes a base having a bottom that can be mounted on the printed circuit board and a top on which the external microprocessor can reside. A plurality of connectors are located on the top of the base for coupling to the external microprocessor when the external microprocessor resides on the top of the base. An in-socket embedded microprocessor is embedded inside the base. The computer system is a single processor computer system with only the in-socket embedded microprocessor functioning when the external microprocessor is not coupled to the plurality of connectors of the base and when the socket is mounted on the printed circuit board. When the external microprocessor is coupled to the plurality of connectors of the base and when the socket is mounted on the printed circuit board, the computer system can be one of (1) a multiprocessor computer system with the external and in-socket embedded microprocessors functioning and (2) the single processor computer system with only the external microprocessor functioning. An in-socket embedded interfacing circuit is also embedded inside the base for interfacing the external microprocessor with circuitry of the computer system on the printed circuit board when the external microprocessor is coupled to the plurality of connectors of the base and when the socket is mounted on the printed circuit board.

A computer system is described that includes a socket for receiving an external microprocessor. The socket is mounted on a printed circuit board of the computer system. An in-socket embedded microprocessor is embedded inside the socket. The computer system is a first type of computer system when the external microprocessor is not secured on the socket. When the external microprocessor is secured on the socket, the computer system is a second type of computer system in which the in-socket embedded microprocessor is disabled from the circuitry on the printed circuit board of the computer system. An in-socket embedded logic is also embedded inside the socket for interfacing the external microprocessor with the circuitry of the computer system on the printed circuit board when the external microprocessor is secured on the socket such that the in-socket embedded microprocessor and the logic occupy substantially minimized space on the printed circuit board.

A multiprocessor computer system is described that includes a socket mounted on a printed circuit board of the computer system. A first microprocessor is secured on the socket mounted on the printed circuit board. A second microprocessor is in-socket embedded inside the socket. An integrated circuit is in-socket embedded inside the socket for interfacing the first and second microprocessors to circuitry of the computer system that resides on the printed circuit board and for controlling operation of the first and second microprocessors with respect to the circuitry of the computer system on the printed circuit board such that space on the printed circuit board occupied by first and second microprocessors and the integrated circuit is substantially minimized.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which:

FIG. 1 shows a perspective view of a prior art computer system that includes a socket for securing a microprocessor on a printed circuit board;

FIG. 2 shows a perspective view of another prior art computer system that includes two sockets, each for securing a microprocessor on a printed circuit board;

FIG. 3 shows a perspective view of a computer system that implements an embodiment of the present invention, wherein the computer system includes a socket that includes an in-socket embedded integrated circuit inside the socket;

FIG. 4 is a cross sectional view of the socket and its respective microprocessor taken along line 4–4 of FIG. 3;

FIG. 5 is a block diagram of one configuration of the computer system of FIG. 3;

FIG. 6 is a block diagram of another configuration of the computer system of FIG. 3;

FIG. 7 is a block diagram of yet another configuration of the computer system of FIG. 3;

FIG. 8 is a block diagram of still another configuration of the computer system of FIG. 3.

DETAILED DESCRIPTION

Referring to FIG. 3, a computer system 30 is shown that includes a socket 31 that implements an embodiment of the present invention. Socket 31 is mounted on a PCB 33 for securing an integrated circuit package 32 on PCB 33. Integrated circuit package 32 may comprise a microprocessor. The microprocessor may be the original microprocessor for computer system 30 or an upgrade microprocessor of computer system 30.

Socket 31 includes an in-socket embedded integrated circuit 31a. In-socket embedded integrated circuit 31a is enclosed or embedded inside socket 31. In-socket embedded integrated circuit 31a may comprise an interface logic for interfacing integrated circuit package 32 with other circuits of computer system 30 when integrated circuit package 32 comprises the upgrade microprocessor of computer system 30. In addition, in-socket embedded integrated circuit 31a may also comprise the original microprocessor of computer system 30. The original microprocessor included in in-socket embedded integrated circuit 31a may or may not be disabled when the upgrade microprocessor is secured on socket 31. With this arrangement, space on PCB 33 that is occupied by socket 31 and in-socket embedded integrated circuit 31a is substantially minimized. In addition, socket 31 and in-socket embedded integrated circuit 31a allow computer system 30 to be easily upgraded without requiring additional logic circuits for the upgrade element. Moreover, the upgrade of computer system 30 can be done without requiring more than one chip site or chip footprint on the PCB.

Computer system 30 includes a number of integrated circuits 34a through 34n mounted on PCB 33. Integrated circuits 34a–34n are connected together via bus 35. Integrated circuits 34a–34n of computer system 30 may include a memory, a keyboard input/output ("I/O") circuit, a display I/O circuit, a disk controller, a serial communication port, and other I/O circuits. The memory may comprise a DRAM, a RAM, a static RAM ("SRAM"), a video RAM ("VRAM"), an EPROM, and/or a flash EPROM. The other I/O circuits may include a local area network ("LAN")interface, a MODEM ("modulation/demodulation"), and a sound circuit.

Computer system 30, in one embodiment, is a personal computer system. In another embodiment, computer system 30 is a laptop computer or a notebook computer. In alternative embodiments, computer system 30 can be a portable computer, a workstation, a minicomputer, a mainframe computer, or any other type of computer. Moreover, computer system 30 can be a single processor computer system or a multi-processor computer system.

Bus 35 includes a number of transmission lines. Data transfer between integrated circuits 34a–34n is conducted via bus 35. Each of integrated circuits 34a–34n can be either surface mounted or pin plugged onto PCB 33. Alternatively, other known mounting techniques can be employed to mount circuits 34a–34n on PCB 33.

For one embodiment, one of integrated circuits 34a–34n is a bus controller that controls the data transmission on bus 35. Integrated circuits 34a–34n may also include a microprocessor, a co-processor, a math processor, a bus transceiver, a peripheral controller, a DRAM controller, a direct memory access ("DMA") controller, a graphics controller, or any other type of intelligent processor or controller.

As shown in FIG. 3, computer system 30 further includes socket 31 mounted on PCB 33. Socket 31 is connected to bus 35 on PCB 33. Socket 31 can be pin plugged or surface mounted on PCB 33. Alternatively, socket 31 can be mounted on PCB 33 by other known mounting techniques.

Socket 31 is used in computer system 30 for securing integrated circuit package 32 on PCB 33. Socket 31 allows low insertion force or zero insertion force mountings of integrated circuit package 32, and a choice of terminals such as solder tail, surface mount, or wire wrap.

In one embodiment, socket 31 is a simple plug-in socket that allows integrated circuit package 32 to be plugged in. In another embodiment, socket 31 is a ZIF socket that allows zero insertion force mounting of integrated circuit package 32 on socket 31. In alternative embodiments, socket 31 can be any other types of sockets that can secure integrated circuit package 32 on PCB 33.

Integrated circuit package 32, when secured on socket 31, is connected to bus 35 through socket 31. In this case, integrated circuit package 32 is part of computer system 30 and functions together with integrated circuits 34a–34n mounted on PCB 33. When integrated circuit package 32 is not secured on socket 31 (i.e., removed from socket 31), integrated circuit package 32 is not connected to bus 35 and does not constitute part of computer system 30. Integrated circuit package 32 can comprise an original element of computer system 30 (i.e., the element with which computer system 30 was originally designed) or an upgrade element of the original element of computer system 30. For example, the original element can be an Intel i386™ microprocessor and the upgrade element can be an Intel i486™ microprocessor. As a further example, the original element can be an Intel i486™ microprocessor and the upgrade element can be a Pentium™ based microprocessor.

As shown in FIG. 3, integrated circuit package 32 includes a plurality of pins 42 that allow integrated circuit package 32 to be pin plugged on socket 31. As also can be seen from FIG. 3, socket 31 includes a plurality of female type contact holes 43 arranged on the top surface of socket 31, each for receiving one of the plurality of pins 42 of integrated circuit package 32. Alternatively, integrated circuit package 32 can be mounted on socket 31 by other known techniques. Integrated circuit package 32, when secured on socket 31, can be removed from socket 31.

Integrated circuit package 32 can comprise a plastic package or a ceramic package. In one embodiment, package 32 is a multi-pin ceramic pin grid array package. In another embodiment, package 32 is a multi-pin plastic leaded chip carrier ("PLCC") package. In alternative embodiments, package 32 can be a multi-pin plastic dual in-line package ("PDIP"), or a multi-pin thin small outline package ("TSOP"). The structure of integrated circuit package 32 is shown in more detail in FIG. 4, which will be described in more detail below.

Referring to FIG. 4, a cross-sectional view of integrated circuit package 32 is shown that includes an integrated circuit 45 packaged inside a package 47. A heat sink 41 is attached to the top of package 47. Heat sink 41 includes a number of fins 41a through 41n. Heat sink 41 is used to aid in dissipating heat generated by integrated circuit 45 of integrated circuit package 32.

Package 47 can be made of ceramic or plastic material. Alternatively, package 47 can be made of other types of materials. For example, glass or epoxy may be used to form package 47.

As described above, integrated circuit package 32 also includes a plurality of pins or leads 42. Pins 42 are used for providing electrical connection for integrated circuit 45. FIG. 4 shows pins 42a–42c and 421–42n of pins 42. As can be seen from FIGS. 3–4, pins 42 are arranged on the bottom of package 47. Pins 42 are arranged in a center-to-center matrix format with three rows around. In other words, the center area of the bottom of package 47 is not mounted with pins 42. As can be seen from FIG. 4, each of pins 42a–42c and 421–42n is connected to integrated circuit 45 via a wire inside package 47.

Integrated circuit 45 of integrated circuit package 32 can be a microprocessor that may be one of X86 microprocessors sold by Intel Corporation of Santa Clara, Calif. Alternatively, integrated circuit 45 can be other types of microprocessors or processors. For example, integrated circuit 45 can be a math processor, a coprocessor, a graphics processor, or any other type of processor. Moreover, integrated circuit 45 can be a microcontroller, such as an I/O controller, a DMA controller, a bus controller, a DRAM controller, or a communications controller.

Referring to FIGS. 3–4 and according to one embodiment of the present invention, socket 31 further includes in-socket embedded integrated circuit 31a. As shown in FIG. 3, in-socket embedded integrated circuit 31a is embedded in the center area of socket 31. Alternatively, in-socket embedded integrated circuit 31a can be embedded in other area of socket 31. As can be seen from FIG. 4, socket 31 includes a base 46. Integrated circuit 31a is in-socket embedded inside base 46. Socket 31 also includes a plurality of pins or leads on the bottom of base 46 for providing electrical connection to bus 35 on PCB 33. FIG. 4 only illustrates leads 44a–44f. Each of leads 44a–44f is connected to embedded integrated circuit 31a via a wire.

As described above, socket 31 also includes contact holes 43. As can be seen from FIGS. 3–4, contact holes 43 are arranged on the top surface of base 46. FIG. 4 only shows contact holes 43a–43c and 431–43n. Each of contact holes 43a–43c and 431–43n is connected to in-socket embedded integrated circuit 31a via a wire.

Contact holes 43 are arranged in the same pattern on base 46 of socket 31 as that of pins 42 on integrated circuit package 32. In other words, each of contact holes 43 on base 46 is in the abutting relationship with its respective one of pins 42 on integrated circuit package 32 when integrated circuit package 32 is secured on socket 31.

By enclosing integrated circuit 31a inside socket 31, the space occupied by socket 31 and integrated circuit 31a on PCB 33 can be substantially minimized. In addition, in-socket embedded integrated circuit 31a can provide logic circuits that allow an upgrade element for computer system 30 to be secured on socket 31. This therefore allows an element of computer system 30 to be upgraded without using more than one chip footprint on PCB 33.

In-socket embedded integrated circuit 31a can be a logic circuit that performs a special function with respect to integrated circuit package 32 or a fully functional microprocessor. In addition, in-socket embedded circuit 31a can comprise various circuits. For example, in-socket embedded circuit 31a may comprise a microprocessor, a processor, or a microcontroller. In-socket embedded integrated circuit 31a may also comprise a bus translator, a cache, a cache controller, and/or an arbiter. In-socket embedded integrated circuit 31a can be fully disabled or partially disabled by integrated circuit package 32 mounted on socket 31. In-socket embedded integrated circuit 31a can also operate in concert with integrated circuit package 32 mounted on socket 31.

In one embodiment, in-socket embedded integrated circuit 31a operates with circuits 34a–34n when integrated circuit package 32 is not secured on socket 31 and is disabled when integrated circuit package 32 is mounted on socket 31. In another embodiment, in-socket embedded integrated circuit 31a does not operate in computer system 30 when integrated circuit package 32 is not mounted on socket 31. When integrated circuit package 32 is mounted on socket 31, in-socket embedded integrated circuit 31a is enabled to function in connection with integrated circuit package 32 mounted on socket 31. In a further embodiment, in-socket embedded integrated circuit 31a operates no matter whether integrated circuit package 32 is mounted on socket 31. In a still further embodiment, in-socket embedded integrated circuit 31a does not function when integrated circuit package 32 mounted on socket 31 is an original element of computer system 30. In-socket embedded integrated circuit 31a functions when integrated circuit package 32 mounted on socket 31 is an upgrade element of the original element. FIGS. 5–8 illustrate different configurations of in-socket embedded integrated circuit 31a in computer system 30 of FIG. 3, which will be described in more detail below.

Referring to FIG. 5, computer system 30 of FIG. 3 is shown in block diagram form in which in-socket embedded integrated circuit 31a comprises a bus translator 31 in accordance with one embodiment of the present invention. As shown in FIG. 5, integrated circuit package 32 includes a microprocessor 50. Microprocessor 50 can be an original microprocessor of computer system 30 or an upgrade microprocessor of computer system 30. FIG. 5 shows the connection of computer system 30 when integrated circuit package 32 is mounted on socket 31 (FIG. 3). Socket 31 is not shown in FIG. 5.

As can be seen in FIG. 5, in-socket embedded integrated circuit 31a includes bus translator 51. Bus translator 51 is used in computer system 30 to interface with microprocessor 50 and bus 35. When microprocessor 50 is the microprocessor with which computer system 30 was originally designed (i.e., the original microprocessor), bus translator 51 does not provide any bus translation function and simply connects microprocessor 50 to bus 35.

However, when microprocessor 50 is a microprocessor different from the original microprocessor of computer system 30 (for example, microprocessor 50 is an upgrade microprocessor of the original microprocessor of computer system 30), bus translator 51 then is enabled to perform necessary bus translation function such that the remaining circuitry of computer system 30 does not perceive any difference.

Bus translator 51 can also perform the function of power supply voltage conversion between the microprocessor to be secured on socket 31 of FIG. 3 and the remaining circuits of computer system 30 on PCB 33.

Bus translator 51 does this by employing known voltage conversion circuitry in it. For example, when microprocessor 50 to be plugged into socket 31 is a 3.3 volt 100 MHz CPU and computer system 30 on PCB 33, however, expects a 5 volt 33 MHz CPU to be secured on socket 31, bus translator 51 then converts the 5 volt power supply to 3.3 volts and supply the converted power supply voltage (i.e., 3.3 volts) to microprocessor 50. In addition, bus translator 51 also drives the signals from microprocessor 50 in accordance with the 33 MHz clock signal such that the remaining circuits of system 30 will not perceive any difference.

When microprocessor 50 is a Pentium ™ based microprocessor and system 30 on PCB 33 expects an i486 ™ based microprocessor, bus translator 51 will then perform the bus protocol and signal translation such that the Pentium ™ based microprocessor can interface with the system resources.

Bus translator 51 can also employ a phase locked loop ("PLL") to double the clock rate of the system clock signal that is provided to microprocessor 50. In this case, microprocessor 50 can then operate at a frequency higher than what the system clock provides.

Referring to FIG. 6, computer system 30 of FIG. 3 is shown in another block diagram form in which in-socket embedded integrated circuit 31a comprises a bus translator 61, a cache 62, and a cache controller 63 in accordance with another embodiment of the present invention. FIG. 6 illustrates the connection of computer system 30 when integrated circuit package 32 is secured on socket 31 (FIG. 3).

As can be seen from FIG. 6, integrated circuit package 32 comprises a microprocessor 60. Microprocessor 60 can be an original microprocessor of computer system 30 or different from the original microprocessor of computer system 30 (e.g., an upgrade microprocessor). Socket 31 (FIG. 3) is not shown in FIG. 6.

Bus translator 61 is used to provide the necessary bus translation function for microprocessor 60 when microprocessor 60 is not the original microprocessor. When microprocessor 60 is the original microprocessor of computer system 30, bus translator 61 simply connects the microprocessor to bus 35.

Cache 62 and cache controller 63 are provided in embedded integrated circuit 31a to provide cache memory for microprocessor 60 or to increase the cache capacity of microprocessor 60 if microprocessor 60 already has its own cache, or to add a further level of cache in addition to the level or levels of cache already in the microprocessor 60. Cache 62 provides high speed memory access for microprocessor 60 that allows microprocessor 60 to function close to its full performance capability.

FIG. 7 illustrates in block diagram form computer system 30 of FIG. 3 that includes embedded integrated circuit 31a that implements another embodiment of the present invention. As shown in FIG. 7, in-socket embedded integrated circuit 31a includes an in-socket embedded microprocessor 71, an in-socket embedded bus translator 72, and an in-socket embedded bypass bus 73. As can be seen from FIG. 7, microprocessor 71, bus translator 72, and bypass bus 73 are all in-socket embedded inside socket 31 of FIG. 3. In-socket embedded microprocessor 71 is the original microprocessor of computer system 30. Integrated circuit package 32 includes an upgrade microprocessor of computer system 30. FIG. 7 shows the connection of computer system 30 when integrated circuit package 32 with upgrade microprocessor 70 is secured on socket 31 of computer system 30.

When integrated circuit package 32 is not secured on socket 31 (FIG. 3), upgrade microprocessor 70 is then not connected with computer system 30 via embedded integrated circuit 31a. In this case, computer system 30 operates with in-socket embedded microprocessor 71. When integrated circuit package 32 is secured on socket 31 (FIG. 1), upgrade microprocessor 70 is part of computer system 30. The connection of upgrade microprocessor 70 in computer system 30 disables in-socket embedded microprocessor 71. This can be done by known technique. For example, in-socket embedded microprocessor 71 may include an input that generates a disable signal to embedded microprocessor 71 when upgrade microprocessor 70 is present in computer system 30. Upon receiving the disable signal, in-socket embedded microprocessor 71 either puts itself into a low power consumption "sleep" mode or completely disables itself in computer system 30.

Upgrade microprocessor 70 is then connected to bus translator 72 via bypass bus 73. Bus translator 72 then performs the necessary bus translation function to interface upgrade microprocessor 70 with the remaining part of computer system 30.

FIG. 8 illustrates in block diagram form computer system 30 Of FIG. 3 that includes in-socket embedded integrated circuit 31a that implements yet another embodiment of the present invention. As shown in FIG. 8, in-socket embedded integrated circuit 31a includes an in-socket embedded microprocessor 81 and an in-socket embedded bus translator and arbiter 82. In-socket embedded microprocessor 81 is the original microprocessor of computer system 30. In-socket embedded integrated circuit 31a also includes an in-socket embedded bus transceiver 83. Bus transceiver is connected between bus translator and arbiter 82 and integrated circuit package 32 when integrated circuit package 32 is plugged into socket 31 of FIG. 3. Integrated circuit package 32 includes an upgrade microprocessor 80 of computer system 30. FIG. 8 shows the connection of computer system 30 when integrated circuit package 32 with upgrade microprocessor 80 is secured on socket 31 of computer system 30.

When integrated circuit package 32 is not secured on socket 31 (FIG. 3), upgrade microprocessor 80 is not part of computer system 30 and computer system 30 only functions with in-socket embedded microprocessor 81. At this time, bus translator and arbiter 82 only connects in-socket embedded microprocessor 81 with bus 35. When integrated circuit package 32 is secured on socket 31 (FIG. 3), upgrade microprocessor 80 is part of computer system 30. In this case, computer system 30 is a dual processor computer system and arbiter 82 arbitrates between microprocessors 80 and 81 for bus access of bus 35. Bus transceiver 83 is used to avoid signal contention between microprocessors 80 and 81 and to isolate electrically upgrade microprocessor 80 from in-socket embedded microprocessor 81 when both microprocessors 80 and 81 are operating in the system. In the case when both microprocessors 80 and 81 are functioning in the system, separate and dedicated control signals will be necessary to connect upgrade microprocessor 80 and in-socket embedded microprocessor 81 to bus translator and arbiter 82 such that bus translator and arbiter 82 can control each of two microprocessors 80 and 81 during operation.

In the foregoing specification, the invention has been described with reference to specific embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A socket for mounting an external integrated circuit on a printed circuit board, comprising:

(A) a base having a bottom for mounting the socket on the printed circuit board and a top for receiving the external integrated circuit;

(B) a plurality of connectors located on the top of the base for coupling to the external integrated circuit when the external integrated circuit resides on the top of the base;

(C) an in-socket embedded integrated circuit embedded inside the base for providing a predetermined electronic function, wherein when the external integrated circuit resides on the top of the base the embedded integrated circuit and the external integrated circuit together occupy minimal space on the printed circuit board.

2. The socket of claim 1, wherein the in-socket embedded integrated circuit interfaces the external integrated circuit to circuitry residing on the printed circuit board, wherein the in-socket embedded integrated circuit is coupled to the plurality of connectors of the base and to the circuitry residing on the printed circuit board.

3. The socket of claim 1, wherein the external integrated circuit is an external microprocessor, wherein the in-socket embedded integrated circuit further comprises a bus translation logic for the external microprocessor.

4. The socket of claim 3, wherein the in-socket embedded integrated circuit further comprises a cache memory.

5. The socket of claim 3, wherein the in-socket embedded integrated circuit further comprises a microprocessor.

6. The socket of claim 1, wherein the plurality of connectors of the base are female type connectors and the external integrated circuit includes a plurality of male type connectors for connecting with the female type connectors.

7. A socket for mounting an external microprocessor on a printed circuit board of a computer system, comprising:

(A) a base having a bottom for mounting the socket on the printed circuit board and a top for receiving the external microprocessor;

(B) a plurality of connectors located on the top of the base for coupling to the external microprocessor when the external microprocessor resides on the top of the base, wherein the external microprocessor is one of (1) a first type of microprocessor and (2) a second type of microprocessor;

(C) an in-socket embedded interface circuit embedded inside the base for interfacing the external microprocessor with circuitry of the computer system on the printed circuit board when the socket is mounted on the printed circuit board and when the external microprocessor coupled to the plurality of connectors of the base is the first type of microprocessor such that the external microprocessor and the interfacing circuit occupy minimal space on the printed circuit board.

8. The socket of claim 7, wherein the first type of microprocessor is an upgrade microprocessor of the second type of microprocessor.

9. The socket of claim 7, wherein the interfacing circuit further comprises a bus translation logic.

10. The socket of claim 9, wherein the interfacing circuit further comprises a cache memory.

11. A socket for mounting an external microprocessor on a printed circuit board of a computer system, comprising:

(A) a base having a bottom for mounting the socket on the printed circuit board and a top for receiving the external microprocessor;

(B) a plurality of connectors located on the top of the base for coupling to the external microprocessor when the external microprocessor resides on the top of the base;

(C) an in-socket embedded microprocessor embedded inside the base, wherein the computer system is a single processor computer system with only the in-socket embedded microprocessor functioning when the socket is mounted on the printed circuit board and when the external microprocessor is not coupled to the plurality of connectors, wherein when the socket is mounted on the printed circuit board and when the external microprocessor is coupled to the plurality of connectors, the computer system can be one of (1) a multiprocessor computer system with the external and in-socket embedded microprocessors functioning and (2) the single processor computer system with only the external microprocessor functioning;

(D) an in-socket embedded interfacing circuit embedded inside the base for interfacing the external microprocessor with circuitry of the computer system on the printed circuit board when the socket is mounted on the printed circuit board and when the external microprocessor is coupled to the plurality of connectors.

12. The socket of claim 11, wherein the external and in-socket embedded microprocessors and the interfacing circuit occupy minimal space on the printed circuit board.

13. The socket of claim 11, wherein when the computer system has both the external and in-socket embedded microprocessors functioning, the interfacing circuit also includes (1) an arbiter circuit for arbitrating between the microprocessors to function with respect to the circuitry on the printed circuit board of the computer system and (2) a bus translation logic for the external microprocessor.

14. The socket of claim 11, wherein when the computer system has only the external microprocessor functioning, the in-socket embedded microprocessor is disabled from the computer system by the external microprocessor.

15. The socket of claim 11, wherein the external microprocessor is an upgrade microprocessor of the in-socket embedded microprocessor.

16. The socket of claim 11, wherein the interfacing circuit is coupled to the plurality of connectors residing on the top of the base and to the circuitry residing on the printed circuit board.

17. A computer system, comprising:

(A) a socket for receiving an external microprocessor, wherein the socket is mounted on a printed circuit board of the computer system;

(B) an in-socket embedded microprocessor embedded inside the socket; wherein the computer system is a first type of computer system when the external microprocessor is not coupled to the socket, wherein when the external microprocessor is coupled to the socket, the computer system is a second type of computer system in which the in-socket embedded microprocessor is disabled from the circuitry on the printed circuit board of the computer system;

(C) an in-socket embedded logic embedded inside the socket for interfacing the external microprocessor with the circuitry of the computer system on the printed circuit board when the external microprocessor is coupled to the socket such that the in-socket embedded microprocessor and the logic occupy minimal space on the printed circuit board.

18. The computer system of claim 17, wherein the first type of computer system comprises the in-socket embedded microprocessor and the second type of computer system comprises the external microprocessor.

19. The computer system of claim 17, wherein the external microprocessor residing on the socket disables the in-socket embedded microprocessor from the circuitry on the printed circuit board.

20. The computer system of claim 17, wherein the logic further comprises a bus translation logic for the external microprocessor.

21. A multiprocessor computer system, comprising:
(A) a socket mounted on a printed circuit board of the computer system;
(B) a first microprocessor coupled to the socked mounted on the printed circuit board;
(c) a second microprocessor in-socket embedded inside the socket;
(D) an integrated circuit in-socket embedded inside the socket for interfacing the first and second microprocessors to circuitry of the computer system that resides on the printed circuit board and for controlling operation of the first and second microprocessors with respect to the circuitry of the computer system on the printed circuit board such that space on the printed circuit board occupied by first and second microprocessors is minimal.

22. The multiprocessor computer system of claim 21, wherein the integrated circuit further comprises a bus translation logic for the external microprocessor.

23. The multiprocessor computer system of claim 22, wherein the integrated circuit further comprises an arbiter circuit for arbitrating between the microprocessors to interface with the circuitry on the printed circuit board of the computer system.

24. The multiprocessor computer system of claim 21, wherein the external microprocessor is an upgrade microprocessor of the in-socket embedded microprocessor.

* * * * *